United States Patent

Harker et al.

[11] Patent Number: 5,349,154
[45] Date of Patent: Sep. 20, 1994

[54] DIAMOND GROWTH BY MICROWAVE GENERATED PLASMA FLAME

[75] Inventors: Alan B. Harker; Ira B. Goldberg, both of Thousand Oaks, Calif.

[73] Assignee: Rockwell International Corporatoin, Seal Beach, Calif.

[21] Appl. No.: 994,060

[22] Filed: Dec. 17, 1992

Related U.S. Application Data

[62] Division of Ser. No. 778,045, Oct. 16, 1991, abandoned.

[51] Int. Cl.$^5$ .............................................. B23K 10/00
[52] U.S. Cl. ................................. 117/102; 219/121.41; 219/121.59; 219/121.51; 219/121.49; 219/686; 219/121.43; 427/575; 117/103; 117/929
[58] Field of Search ............... 219/10.55 A, 10.55 F, 219/10.55 R, 121.43, 121.44, 121.41, 121.59, 121.51, 121.49, 686; 156/DIG. 68; 427/569, 575

[56] References Cited

U.S. PATENT DOCUMENTS

| | | | |
|---|---|---|---|
| 4,665,296 | 5/1987 | Iwata et al. | 219/121.52 |
| 4,777,336 | 10/1988 | Asmussen | 219/10.55 M |
| 4,908,492 | 3/1990 | Okamoto et al. | 219/121.52 |
| 4,924,061 | 5/1990 | Labat et al. | 219/121.52 |
| 4,990,740 | 2/1991 | Meyer | 219/121.52 |
| 5,051,557 | 9/1991 | Satzger | 219/121.52 |
| 5,083,004 | 1/1992 | Wells et al. | 219/121.5 |
| 5,243,170 | 9/1993 | Maruyama et al. | 219/121.59 |

FOREIGN PATENT DOCUMENTS 1308900  12/1989  Japan .

Primary Examiner—Mark H. Paschall
Attorney, Agent, or Firm—John C. McFarren

[57] ABSTRACT

A swirl flow microwave plasma torch is provided for the growth of diamond films. The swirl flow torch incorporates an injection nozzle that directs reactant gases into a cylindrical flow tube extending through the center of a tuned microwave cavity. The outer surface of the nozzle comprises a contoured, conical shape that causes inert gas, directed tangentially against the outer surface of the nozzle, to swift in a helical path that surrounds and confines the reactant gas emerging from the nozzle. The tuned cavity is coupled to a microwave energy source to generate a highly localized plasma in the reactant gas in the center of the sheathing swirl of inert gas. The swirl of inert gas contains the plasma in a well-defined shape, prevents in-diffusion of undesirable gases, forms a boundary layer to prevent plasma migration, and provides flow tube cooling. The reactant gas flow forces the plasma out of the flow tube to form a plasma flame that can be impinged on a substrate to induce diamond growth.

13 Claims, 1 Drawing Sheet

DIAMOND GROWTH BY MICROWAVE GENERATED PLASMA FLAME

This application is a division of application Ser. No. 778,045, filed Oct. 16, 1991, now abandoned.

TECHNICAL FIELD

The present invention relates to techniques for growing diamond films and, in particular, to a method using a swirl flow microwave plasma torch for efficient growth of diamond films.

BACKGROUND OF THE INVENTION

Deposition of a synthetic polycrystalline diamond thin film on a substrate surface is generally accomplished at low pressures by thermal or plasma breakdown of a hydrocarbon in the presence of hydrogen. Morphology of the synthetic diamond film is governed by the nucleation and growth of individual crystalline grains on the substrate. Although various techniques for growing diamond films are well known, improved methods of growing polycrystalline diamond films are being investigated by numerous commercial and government organizations. Many investigators are pursuing high pressure arc or flame techniques for rapid bulk growth, while some are attempting to increase the area coverage with microwave plasma sources. This great interest in the field of diamond formation has developed because synthetic polycrystalline diamond film has potential as a high temperature semiconductor and offers a combination of highly desirable physical properties, such as hardness, chemical inertness, transparency to light from ultraviolet to far infrared, and resistance to laser damage.

The primary methods used to form polycrystalline diamond include: 1) DC plasma jet, formed by a simple DC discharge into a flowing gas; 2) microwave plasma chamber, using a low pressure microwave cavity at 10 to 100 torr of gas, to form an internal plasma ball; 3) RF discharge between parallel plates; 4) RF discharge using a coil and a flowing gas tube; 5) RF discharge using inductive coupling to produce a one atmosphere plasma torch (ICP); 6) hot filament reactor using a 2000° C. filament to break up hydrogen and hydrocarbon thermally at low pressures; 7) microwave torch using a 2.45 GHz microwave magnetron with a copper rod to absorb microwave energy and produce a plasma jet; 8) oxy-acetylene or other hydrocarbon burning torch having a temperature in excess of 2000° C. in the main flame; and 9) microwave torch using a lossy cavity to induce a low pressure plasma in a closed-flow tube.

Each of the foregoing techniques has some particular limitation when applied to the fabrication of diamond films on a large scale. These limitations include incorporation of metal impurities from anodes and cathodes that are used to produce arcs, incomplete combustion and formation of graphite in the flames, an inability to rotate samples uniformly in tuned microwave cavities, and a generally slow rate of diamond growth. Filament growth systems eliminate some of these problems, but they have other limitations such as filament breakage and highly localized deposition. Thus, there is a need for improved techniques to form high quality polycrystalline diamond films efficiently and at high rates of growth.

SUMMARY OF THE INVENTION

The method of the present invention uses a swirl flow plasma torch for the growth of diamond films. The swirl flow torch incorporates an injection nozzle that directs reactant gases, surrounded by a sheathing swirl of an inert gas, through the center of a tuned microwave cavity. The nozzle is connected to a gas supply tube to inject a stream of reactant gases, typically including hydrogen, oxygen, and a hydrocarbon, directly into a cylindrical flow tube surrounding the nozzle and extending through the tuned cavity. The portion of the flow tube extending through the microwave cavity is made of glass, quartz, sapphire, or other material that does not absorb microwave energy. The inert gas is directed into the flow tube as a stream tangential to the outer surface of the nozzle and at approximately a right angle with respect to the stream of reactant gas flowing through the nozzle. The outer surface of the nozzle comprises a contoured, conical shape that causes the inert gas to swirl in a helical path surrounding the reactant gas emerging from the nozzle. The tuned cavity is coupled to a microwave source, such as a magnetron, that provides energy to produce a highly localized plasma in the reactant gas in the center of the sheathing swirl of inert gas. The inert sheathing gas provides a boundary layer to prevent plasma migration to the flow tube walls and to aid in wall cooling. A high reactant gas flow forces the plasma to extend out of the cavity and flow tube to form a plasma flame that can be impinged on a substrate to induce diamond growth.

A principal object of the invention is the efficient production of high quality diamond films. A feature of the invention is the use of a swirl injection nozzle that directs reactant gases, surrounded by a sheathing swirl of an inert gas, through the center of a tuned microwave cavity to produce a plasma flame. Advantages of the invention include efficient coupling of energy into the gas plasma; elimination of hot components that can cause contamination of the gas stream and diamond film; and diamond deposition over a wide range of pressures and cavity sizes, thereby allowing optimization for large area coverage, local area deposition, or brazing.

BRIEF DESCRIPTION OF THE DRAWINGS

For a more complete understanding of the present invention and for further advantages thereof, the following Detailed Description of the Preferred Embodiment makes reference to the accompanying Drawings, in which.

DETAILED DESCRIPTION OF THE PREFERRED EMBODIMENT

Figure 1:
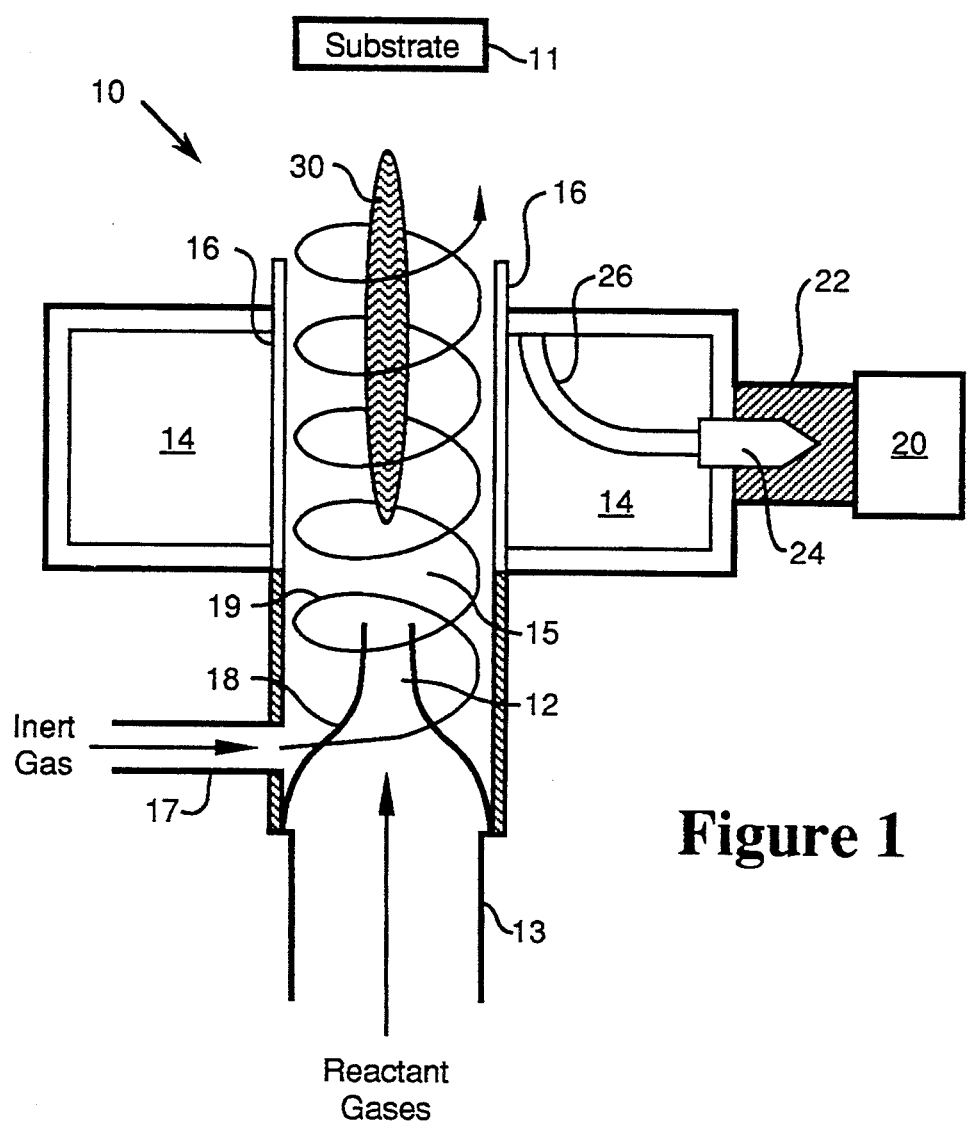
FIG. 1 is a schematic cross-sectional diagram of a swirl flow microwave plasma torch used in the method of the present invention.

A preferred embodiment of the microwave plasma torch of the present invention is illustrated in schematic cross-section in FIG. 1. The microwave torch comprises a swirl flow plasma torch 10 for growth of a diamond film on substrate 11. Swirl flow torch 10 incorporates an injection nozzle 12 that directs reactant gases through the center of a tuned microwave cavity 14. Cavity 14 may include a provision for air or water cooling (not shown), depending on the magnitude of the microwave power. Nozzle 12 is connected to a gas supply tube 13 and inserted into a cylindrical tube 16 for injecting reactant gases, typically including hydrogen, oxygen, and a hydrocarbon (such as methane, for example), directly into a flow chamber 15 formed by cylindrical tube 16 and extending through cavity 14. The portion of cylindrical tube 16 that extends through tuned cavity 14 comprises glass, quartz, sapphire, or other material that does not absorb microwave energy. Inert gas, such as argon, helium, or neon, is directed through an inlet port 17 into flow chamber 15 and against the outer surface 18 of nozzle 12. The inert gas is injected in a stream tangential to outer surface 18 of nozzle 12 and at approximately a right angle with respect to the stream of reactant gas flowing through nozzle 12 from supply tube 13. Outer surface 18 of nozzle 12 comprises a contoured, conical shape that causes the inert gas to rotate within chamber 15 in a helical path or swirl 19 surrounding the reactant gas emerging from nozzle 12.

Tuned cavity 14 is coupled to a microwave source, such as a magnetron 20, that provides energy through a coaxial cable or waveguide 22, an adapter 24, and a coupling loop 26 to produce a highly localized plasma 30 in the reactant gas in the center of the sheathing swirl 19 of inert gas. Microwave source 20 or waveguide 22 typically includes a means for matching the impedance of source 20 with the impedance of cavity 14. This may be accomplished, for example, by a tuner with screws that can be inserted into waveguide 22, or by a T-section of coaxial cable in which one arm of the T-section includes a moveable short circuit. As illustrated in FIG. 1, coaxial cable or waveguide 22 is connected to cavity 14 by adapter 24. Coupling loop 26 serves to direct the microwave energy into cavity 14. The end of loop 26, which connects adapter 24 to the housing of cavity 14, terminates near cylindrical flow tube 16 so that the microwave energy can easily initiate and sustain gas plasma 30.

The sheathing swirl of inert gas 19 produces a low pressure region along the axis of tube 16, similar to the low pressure in the eye of a hurricane or tornado. This low pressure zone ensures that the reactant gas is confined to the central region of tube. The swirl of inert gas 19 thus provides a well-defined plasma shape and a boundary layer to prevent migration of plasma 30 to the walls of tube 16. The helical flow of inert gas 19 also provides wall cooling and prevents in-diffusion of undesirable gases such as nitrogen. A high reactant gas flow out of nozzle 12 forces plasma 30 to extend out of tube 16 and tuned cavity 14 to form a plasma flame 30 that can be impinged on substrate 11 to induce diamond growth. An outer chimney or vessel (not shown) is required for enclosing torch 10 and substrate 11 to avoid entrainment of contaminating atmospheric gases in plasma flame 30.

The dimensions of microwave cavity 14 are scaled to match the frequency of the microwave energy produced by magnetron 20. A prototype of microwave torch 10 was constructed with cavity 14 having an outside diameter of 6" and a thickness of 2" with an inside diameter of 3.88" and height of 0.55" to correspond to a magnetron operating frequency of 2.45 GHz. Coupling loop 26 was 0.25" in diameter to allow microwave power between 900 and 3,000 watts to enter cavity 14. The inside height of cavity 14 was kept between 0.5" and 0.8" to ensure that a strong electric field was maintained at the center of cavity 14. This allows the use of relatively high inert and reactant gas flows and high pressures for efficient diamond deposition. The pressure in cavity 14 was varied from 0.2 to 1.0 atmosphere, the inert gas flow was varied from 0.03 to 0.25 pounds per minute, and the reactant gas flow was varied from 0.01 to 0.05 pounds per minute. At one atmosphere, plasma flame 30 was about 1.5 cm and produced high quality diamond growth at up to approximately 20 $\mu$m per hour on a substrate area of about 1×1 cm.

Microwave torch 10 of the present invention induces plasma 30 using gas mixtures, microwave radiation, temperatures, and pressures similar to those employed by methods well known in the art. However, tuned cavity 14 of the present invention provides more efficient coupling of energy into the gas plasma. The use of injection nozzle 12 and a sheathing swirl of inert gas 19 eliminates hot components that can cause contamination of the gas stream and subsequent contamination of the diamond film. Furthermore, microwave torch 10 can be can be operated over a wide range of pressure and scaled to different sizes with the use of different microwave frequencies. This broad range of parameters permits scaling up for large area diamond coverage or scaling down for diamond deposition or brazing in local areas.

Although the present invention has been described with respect to specific embodiments thereof, various changes and modifications can be carded out by those skilled in the art without departing from the scope of the invention. Therefore, it is intended that the present invention encompass such changes and modifications as fall within the scope of the appended claims.

We claim:

1. A method of growing a high quality diamond film, comprising the steps of:
    providing a tuned microwave cavity;
    extending a gas flow tube through said tuned microwave cavity, said flow tube having an inner wall;
    injecting a flow of reactant gases into said flow tube;
    injecting a helical swirl of inert gas into said flow tube, said swirl of inert gas surrounding said flow of reactant gases and providing a barrier layer between said reactant gases and said flow tube wall;
    directing microwave energy into said tuned microwave cavity to generate a reactant gas plasma in said flow tube, said swirl of inert gas preventing migration of said plasma to said flow tube wall;
    producing a plasma flame extending from said flow tube without contacting said flow tube wall; and
    impinging said plasma flame on a substrate for growing said high quality diamond film on said substrate.

2. The method of claim 1, wherein said steps of injecting reactant and inert gases into said flow tube further comprise the steps of:
    providing an injection nozzle having a contoured outer surface;
    mounting said nozzle with said contoured outer surface within said flow tube;
    injecting said reactant gases through said nozzle and into said flow tube; and
    injecting said inert gas tangentially against said contoured nozzle surface, thereby forming said helical swirl of inert gas surrounding said reactant gases.

3. The method of claim 1, wherein said step of directing microwave energy further comprises the steps of:
    providing a magnetron for generating said microwave energy;
    coupling said magnetron to said tuned microwave cavity; and directing said microwave energy through said coupling means to said tuned microwave cavity.

4. The method of claim 1, wherein said step of producing a plasma flame comprises injecting a high flow of reactant gases into said flow tube to form said plasma flame extending from said flow tube for impinging on said substrate.

5. The method of claim 1, wherein the step of injecting a flow of reactant gases comprises injecting a mixture of hydrogen, oxygen, and a hydrocarbon.

6. A method of growing a high quality diamond film on a substrate, comprising the steps of:

providing a tuned microwave cavity;

extending a gas flow tube through said tuned microwave cavity, said gas flow tube having an inner wall;

providing an injection nozzle having a contoured outer surface mounted within said gas flow tube;

injecting a flow of reactant gases through said nozzle and into said gas flow tube;

injecting a flow of inert gas into said gas flow tube tangentially against said contoured outer nozzle surface, said flow of inert gas forming a helical swirl of inert gas surrounding said flow of reactant gases and providing a barrier layer between said reactant gases and said gas flow tube wall;

directing microwave energy into said tuned microwave cavity to generate a reactant gas plasma in said gas flow tube, said swirl of inert gas preventing migration of said plasma to said gas flow tube wall;

producing a plasma flame extending from said gas flow tube without contacting said gas flow tube wall; and impinging said plasma flame on said substrate for growing said high quality diamond film on said substrate.

7. The method of claim 6, wherein said step of directing microwave energy further comprises the steps of:

providing a magnetron for generating said microwave energy;

coupling said magnetron to said tuned microwave cavity; and directing said microwave energy through said coupling means to said tuned microwave cavity.

8. The method of claim 7, wherein said step of producing a plasma flame comprises injecting a high flow of reactant gases to force said plasma flame to extend out of said gas flow tube for impinging on said substrate and growing said diamond film.

9. The method of clam 8, wherein the step of injecting a flow of reactant gases comprises injecting a mixture of hydrogen, oxygen, and a hydrocarbon.

10. A method of growing a high quality diamond film on a substrate, comprising the steps of:

injecting a mixture of reactant gases comprising hydrogen, oxygen, and a hydrocarbon into a gas flow tube;

injecting inert gas into said flow tube to form a helical swirl of inert gas for surrounding and confining said reactant gases, providing a boundary layer between said reactant gases and said gas flow tube, and preventing indifussion of undesirable gases;

extending said gas flow tube through a tuned microwave cavity;

directing microwave energy into said tuned microwave cavity to generate a reactant gas plasma flame, said helical swirl of inert gas preventing migration and contact of said plasma flame with said gas flow tube, said plasma flame extending from said gas flow tube; and impinging said plasma flame on said substrate for growing said diamond film on said substrate.

11. The method of claim 10, wherein said steps of injecting reactant and inert gases into said gas flow tube further comprise the steps of:

providing an injection nozzle having a contoured outer surface;

mounting said nozzle with said contoured outer surface within said gas flow tube;

injecting said reactant gases through said nozzle and into said gas flow tube; and injecting said inert gas tangentially against said contoured nozzle surface, thereby forming said helical swirl of inert gas surrounding said reactant gases.

12. The method of claim 11, wherein said step of directing microwave energy further comprises the steps of:

providing a magnetron for generating said microwave energy;

coupling said magnetron to said tuned microwave cavity; and directing said microwave energy through said coupling means to said tuned microwave cavity.

13. The method of claim 12, wherein said step of injecting reactant gases comprises injecting hydrogen, oxygen, and methane into said gas flow tube.

* * * * *